(12) United States Patent
Nagase et al.

(10) Patent No.: US 9,556,518 B2
(45) Date of Patent: Jan. 31, 2017

(54) RAW MATERIAL GAS SUPPLY APPARATUS FOR SEMICONDUCTOR MANUFACTURING EQUIPMENT

(71) Applicant: FUJIKIN INCORPORATED, Osaka (JP)

(72) Inventors: Masaaki Nagase, Osaka (JP); Atsushi Hidaka, Osaka (JP); Kaoru Hirata, Osaka (JP); Ryousuke Dohi, Osaka (JP); Kouji Nishino, Osaka (JP); Nobukazu Ikeda, Osaka (JP)

(73) Assignee: FUJIKIN INCORPORATED, Osaka (JP)

(*) Notice: Subject to any disclaimer, the term of this patent is extended or adjusted under 35 U.S.C. 154(b) by 44 days.

(21) Appl. No.: 14/150,263

(22) Filed: Jan. 8, 2014

(65) Prior Publication Data

US 2014/0190581 A1     Jul. 10, 2014

Related U.S. Application Data

(63) Continuation-in-part of application No. PCT/JP2012/002832, filed on Apr. 25, 2012.

(30) Foreign Application Priority Data

Jul. 8, 2011  (JP) .................. 2011-151375

(51) Int. Cl.
  *C23C 16/448* (2006.01)
  *C23C 16/455* (2006.01)
  *C23C 16/52* (2006.01)

(52) U.S. Cl.
  CPC ......... *C23C 16/448* (2013.01); *C23C 16/4485* (2013.01); *C23C 16/45561* (2013.01); *C23C 16/52* (2013.01); *Y10T 137/86485* (2015.04)

(58) Field of Classification Search
  CPC ............... C23C 16/448; C23C 16/4485; C23C 16/45561
  (Continued)

(56) References Cited

U.S. PATENT DOCUMENTS 4,622,988 A * 11/1986 Takimoto et al. ............ 137/209
4,787,254 A    11/1988 Duckworth
(Continued)

FOREIGN PATENT DOCUMENTS

JP    02-255595 A    10/1990
JP    5-102024 A    4/1993
(Continued)

OTHER PUBLICATIONS

International Search Report issued in application PCT/JP2012/001117, completed Apr. 2, 2012 and mailed Apr. 17, 2012.
(Continued)

*Primary Examiner* — Kevin Murphy
(74) *Attorney, Agent, or Firm* — Griffin and Szipl PC (57) ABSTRACT

A raw material gas supply apparatus includes a liquid raw material gas supply source, a source tank storing liquid raw material, a gas distribution passage through which raw material gas comprising steam of the liquid raw material is supplied to a process chamber from the source tank, an automatic pressure regulator installed on an upstream side of the gas passage, wherein the automatic pressure regulator keeps supply pressure of the raw material gas at a set value, a supply gas switching valve installed on a downstream side of the gas passage, wherein this valve opens and closes the gas passage, an orifice provided on at least one of an inlet side or outlet side of the valve, wherein the orifice regulates flow rate of the raw material gas, and a constant temperature heating device heats the source tank, the gas passage, the valve and the orifice to a set temperature.

7 Claims, 4 Drawing Sheets

(58) Field of Classification Search
USPC .................................................. 118/715, 724
See application file for complete search history.

(56) References Cited

U.S. PATENT DOCUMENTS

| | | | |
|---|---|---|---|
| 5,451,258 | A | 9/1995 | Hillman et al. |
| 5,669,408 | A | 9/1997 | Nishino et al. |
| 5,791,369 | A | 8/1998 | Nishino et al. |
| 5,816,285 | A | 10/1998 | Ohmi et al. |
| 5,865,205 | A | 2/1999 | Wilmer |
| 6,119,710 | A | 9/2000 | Brown |
| 6,205,409 | B1 | 3/2001 | Zvonar |
| 6,210,482 | B1 | 4/2001 | Kitayama et al. |
| 6,314,992 | B1 | 11/2001 | Ohmi et al. |
| 6,539,968 | B1 | 4/2003 | White et al. |
| 6,698,728 | B1 | 3/2004 | Ravetz et al. |
| 7,833,353 | B2 * | 11/2010 | Furukawahara et al. ..... 118/726 |
| 2001/0013363 | A1 | 8/2001 | Kitayama et al. |
| 2002/0174898 | A1 | 11/2002 | Lowery et al. |
| 2003/0072875 | A1 | 4/2003 | Sandhu |
| 2004/0007180 | A1 | 1/2004 | Yamasaki et al. |
| 2004/0144178 | A1 | 7/2004 | Ohmi et al. |
| 2005/0173003 | A1 | 8/2005 | Laverdiere et al. |
| 2005/0221004 | A1 * | 10/2005 | Kilpela et al. ............. 427/248.1 |
| 2006/0008328 | A1 | 1/2006 | Morgan et al. |
| 2007/0254093 | A1 | 11/2007 | Nijhawan et al. |
| 2008/0009978 | A1 | 1/2008 | Smirnov |
| 2008/0220164 | A1 | 9/2008 | Bauch et al. |
| 2009/0095068 | A1 | 4/2009 | Redemann et al. |
| 2009/0214779 | A1 | 8/2009 | Sarigiannis et al. |
| 2009/0326719 | A1 | 12/2009 | Nagase et al. |
| 2010/0012026 | A1 | 1/2010 | Hirata et al. |
| 2010/0108154 | A1 | 5/2010 | Minami et al. |
| 2010/0139775 | A1 | 6/2010 | Ohmi et al. |
| 2010/0178423 | A1 * | 7/2010 | Shimizu et al. ........... 427/248.1 |
| 2010/0192854 | A1 | 8/2010 | Nishino et al. |
| 2010/0304567 | A1 | 12/2010 | Sakai et al. |
| 2011/0100483 | A1 * | 5/2011 | Nagata et al. ................ 137/334 |
| 2011/0108126 | A1 | 5/2011 | Monkowski et al. |
| 2011/0265895 | A1 | 11/2011 | Okabe |

FOREIGN PATENT DOCUMENTS

| | | | |
|---|---|---|---|
| JP | 06-104155 | A | 4/1994 |
| JP | 07-118862 | A | 5/1995 |
| JP | 2000-066732 | A | 3/2000 |
| JP | 2000-282242 | A | 10/2000 |
| JP | 2000-323464 | A | 11/2000 |
| JP | 2001-313288 | A | 11/2001 |
| JP | 3291161 | B2 | 6/2002 |
| JP | 2002-543589 | A | 12/2002 |
| JP | 2003-013233 | A | 1/2003 |
| JP | 2003-286573 | A | 10/2003 |
| JP | 2003-323217 | A | 11/2003 |
| JP | 2004-091917 | A | 3/2004 |
| JP | 2004-246826 | A | 9/2004 |
| JP | 2004-256864 | A | 9/2004 |
| JP | 2005-149075 | A | 6/2005 |
| JP | 2006-038832 | A | 2/2006 |
| JP | 2007-095042 | A | 4/2007 |
| JP | 2007-250803 | A | 9/2007 |
| JP | 2008-010510 | A | 1/2008 |
| JP | 4137666 | B2 | 6/2008 |
| JP | 2009-059871 | A | 3/2009 |
| JP | 2009-076807 | A | 4/2009 |
| JP | 2009-226408 | A | 10/2009 |
| JP | 2009-252760 | A | 10/2009 |
| JP | 2010-153741 | A | 7/2010 |
| JP | 2011-006782 | A | 1/2011 |
| JP | 4605790 | B2 | 1/2011 |
| JP | 2011-137235 | A | 7/2011 |
| JP | 2001-258184 | A | 9/2011 |
| WO | 00/65649 | A1 | 11/2000 |
| WO | 01/42539 | A1 | 6/2001 |
| WO | WO 2009122646 | A1 * | 10/2009 ................ B01J 4/02 |

OTHER PUBLICATIONS http://www.massflow-online.com/faqs/what-do-Inmin-Ismin-slm-and-sccm-stand-for/ (2012)(downloaded Sep. 11, 2013).
English translation of the International Preliminary Report on Patentability issued in application PCT/JP2012/001117, mailed Apr. 17, 2012.
International Search Report issued in application PCT/JP2012/002395 completed Apr. 20, 2012 and mailed May 1, 2012.
English translation of the International Preliminary Report on Patentability issued in application PCT/JP2012/002395, on Nov. 13, 2013.
International Search Report issued in application PCT/JP2012/002394 completed Apr. 20, 2012 and mailed May 1, 2012.
English translation of the International Preliminary Report on Patentability issued in application PCT/JP2012/002394, on Nov. 13, 2013.
International Search Report issued in application PCT/JP2012/002832, completed Sep. 21, 2012 and mailed Oct. 2, 2012.
English translation of the International Preliminary Report on Patentability issued in application PCT/JP2012/002832 on Jan. 14, 2014.
"Standard Cubic Centimeters Per Minute," at http://www.all-acronyms.com/SCCM standard_cubic_centimeters_per_minute/213202 (downloaded Nov. 14, 2013).
"Tetraethyl Orthosilicate" (Air Products and Chemicals, Inc. 2012).
International Search Report issued in application PCT/JP2012/003783, completed Jul. 31, 2012 and mailed Aug. 7, 2012.
English translation of the International Preliminary Report on Patentability issued in application PCT/JP2012/003783, on Feb. 4, 2014.
International Search Report issued in application PCT/JP2012/004559, completed Aug. 6, 2012 and mailed Aug. 14, 2012.
Office Action issued in co-pending related U.S. Appl. No. 14/065,078 on Aug. 27, 2015.
Office Action issued in co-pending related U.S. Appl. No. 14/075,740 on Jan. 6, 2016.
Office Action issued in co-pending related U.S. Appl. No. 14/075,890 on Jan. 6, 2016.
Office Action issued in co-pending related U.S. Appl. No. 14/170,953 on May 13, 2016.
Office Action issued Sep. 6, 2016 in co-pending related U.S. Appl. No. 14/170,953.
Office Action issued Jul. 27, 2016 in co-pending related U.S. Appl. No. 14/343,226.
Office Action issued in co-pending U.S. Appl. No. 14/065,078 on Nov. 14, 2016.

* cited by examiner

Prior Art

FIG. 5

Prior Art

US 9,556,518 B2

RAW MATERIAL GAS SUPPLY APPARATUS FOR SEMICONDUCTOR MANUFACTURING EQUIPMENT

This is a Continuation-in-Part Application in the United States of International Patent Application No. PCT/JP2012/002832 filed Apr. 25, 2012, which claims priority on Japanese Patent Application No. 2011-151375, filed Jul. 8, 2011. The entire disclosures of the above patent applications are hereby incorporated by reference.

FIELD OF THE INVENTION

The present invention relates to an improvement in a gas supply apparatus for semiconductor manufacturing equipment by a so-called "ALD method," and, in particular, to a raw material gas supply apparatus for semiconductor manufacturing equipment that is capable of rapidly and accurately switching to supply a plurality of processing gases (e.g., raw material gases) while highly accurately controlling the flow rate of those processing gases to the inside of a process chamber.

BACKGROUND OF THE INVENTION (DESCRIPTION OF THE RELATED ART)

A so-called ALD (Atomic Layer Deposition) method has been widely utilized for film formation processes of semiconductor manufacturing because of its good thermal history and step coverage.

Thus, this ALD method supplies steam flow of two or more raw material gases and liquid raw material gases alternatively to the inside of a process chamber, in order to form a film due to a chemical reaction on a surface of a wafer, or the like. That is, by employing the ALD method, it is possible to highly accurately form a film thickness corresponding to one atomic layer in a so-called "one sequence."

A film formation of titanium nitride (TiN), using titanium tetrachloride ($TiCl_4$) and ammonia ($NH_3$) as precursors, is an important process in semiconductor manufacturing. Furthermore, the accuracy of control of a flow rate of supplying titanium tetrachloride ($TiCl_4$) has great effects on the film thickness of the titanium nitride and on the quality of the titanium nitride film.

Therefore, various techniques with respect to the supply of raw material gases, such as titanium tetrachloride ($TiCl_4$), have been conventionally developed. For example, in a conventional raw material gas supply apparatus (Japanese Patent No. 4605790) of FIG. 4, a carrier gas $G_1'$ is supplied to the inside of a source tank 25 through a pressure regulator 22 and a mass flow controller 23 from a carrier gas source 21, and a mixed gas $G_0'$ of steam $G_2'$ of a liquid raw material 24 and the carrier gas $G_1'$ is supplied to the inside of a process chamber 29 through a pressure control valve CV and an opening/closing valve $V_1$, to control the supply of the gas $G_0'$ to the process chamber 29 by controlling the opening or closing of the pressure control valve CV and the opening/closing valve $V_1$.

Figure 4:
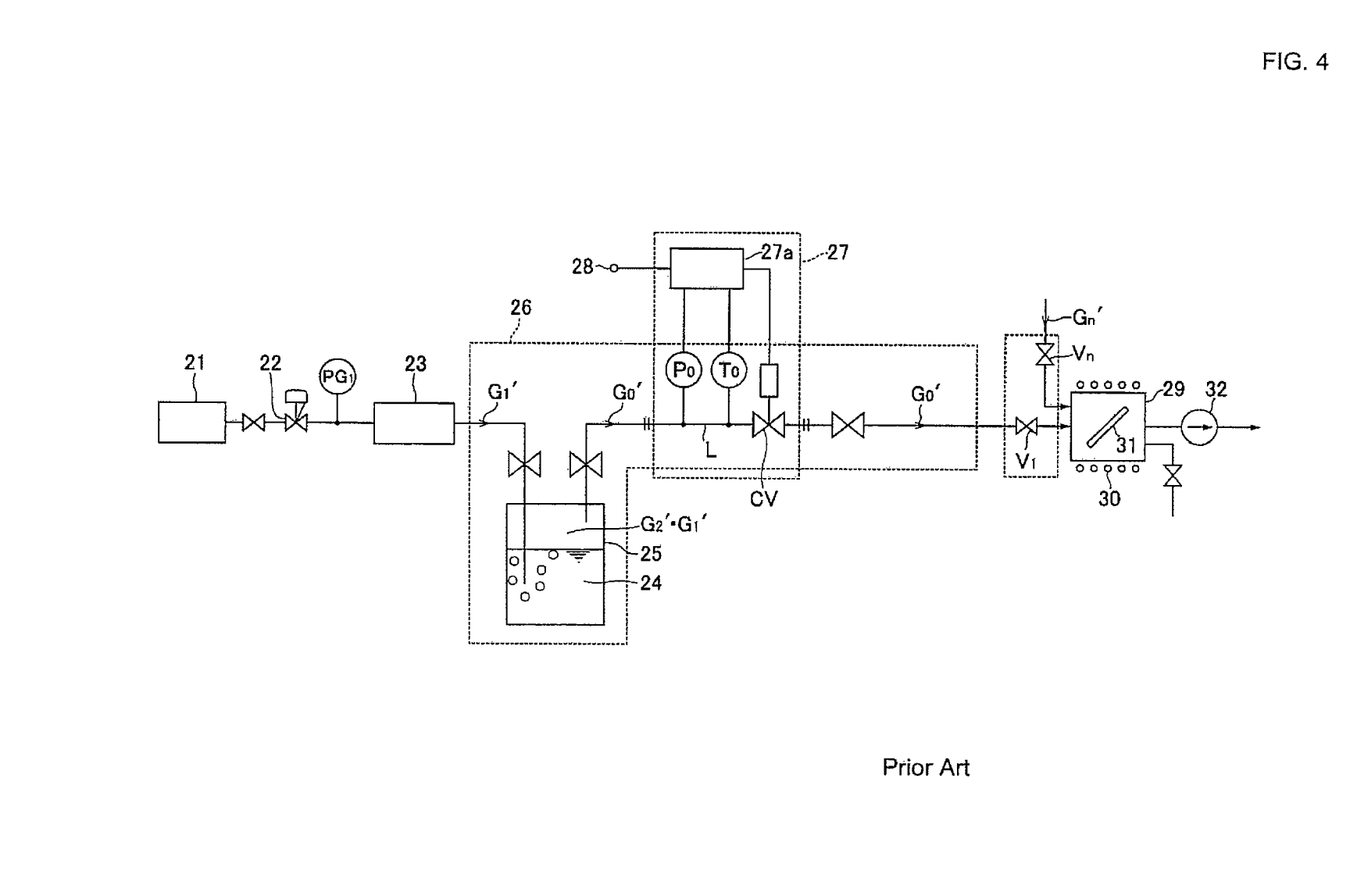
FIG. 4 is a systematic schematic diagram showing a configuration of a conventional raw material gas supply apparatus.

In addition, in FIG. 4, reference numeral 27 denotes an automatic pressure regulating device for regulating the pressure of the inside of the source tank 25, and the automatic pressure regulating device computes the tank internal pressure from the pressure in a pipe passage L (as measured by pressure sensor $P_O$) and a detection value of a temperature (as measured by temperature sensor $T_O$), and controls the opening or closing of the pressure control valve CV in a direction in which a difference with a set pressure input from a terminal 28 becomes zero, thereby keeping the source tank internal pressure at a set value. Reference numeral 27a denotes a controller within automatic pressure regulating device 27. Furthermore, reference numeral 26 denotes a constant temperature heating unit, reference symbol 30 denotes a heater, reference symbol 31 denotes a wafer, Gn' denotes another raw material gas, Vn denotes an opening/closing valve for the other raw material gas Gn'.

In the above-described raw material gas supply apparatus of FIG. 4, first, the pressure of the carrier gas $G_1'$, which is supplied to the inside of the source tank 25, is set to a predetermined pressure value $PG_1$ (as measured by the corresponding pressure sensor) by the pressure regulator 22, and its supply flow rate is set to a predetermined flow rate value by the thermal type mass flow control system (mass flow controller) 23. Moreover, the portion of the source tank 25, and the like, are heated and kept at a high temperature of about 150° C. The supply quantity of the carrier gas $G_1'$, the temperature of the source tank 25, and the internal pressure of the source tank 25 (the pressure of the mixed gas $G_0'$) are respectively kept at set values, thereby supplying the mixed gas $G_0'$ of a constant mixture ratio with a constant flow rate to the process chamber 29 through the pressure control valve CV while highly accurately controlling at a predetermined flow rate value, which is proportional to a set flow rate by the thermal type mass flow control system 23, and the mixed gas $G_0'$ is supplied to the process chamber 29 by opening the opening/closing valve $V_1$.

Figure 5:
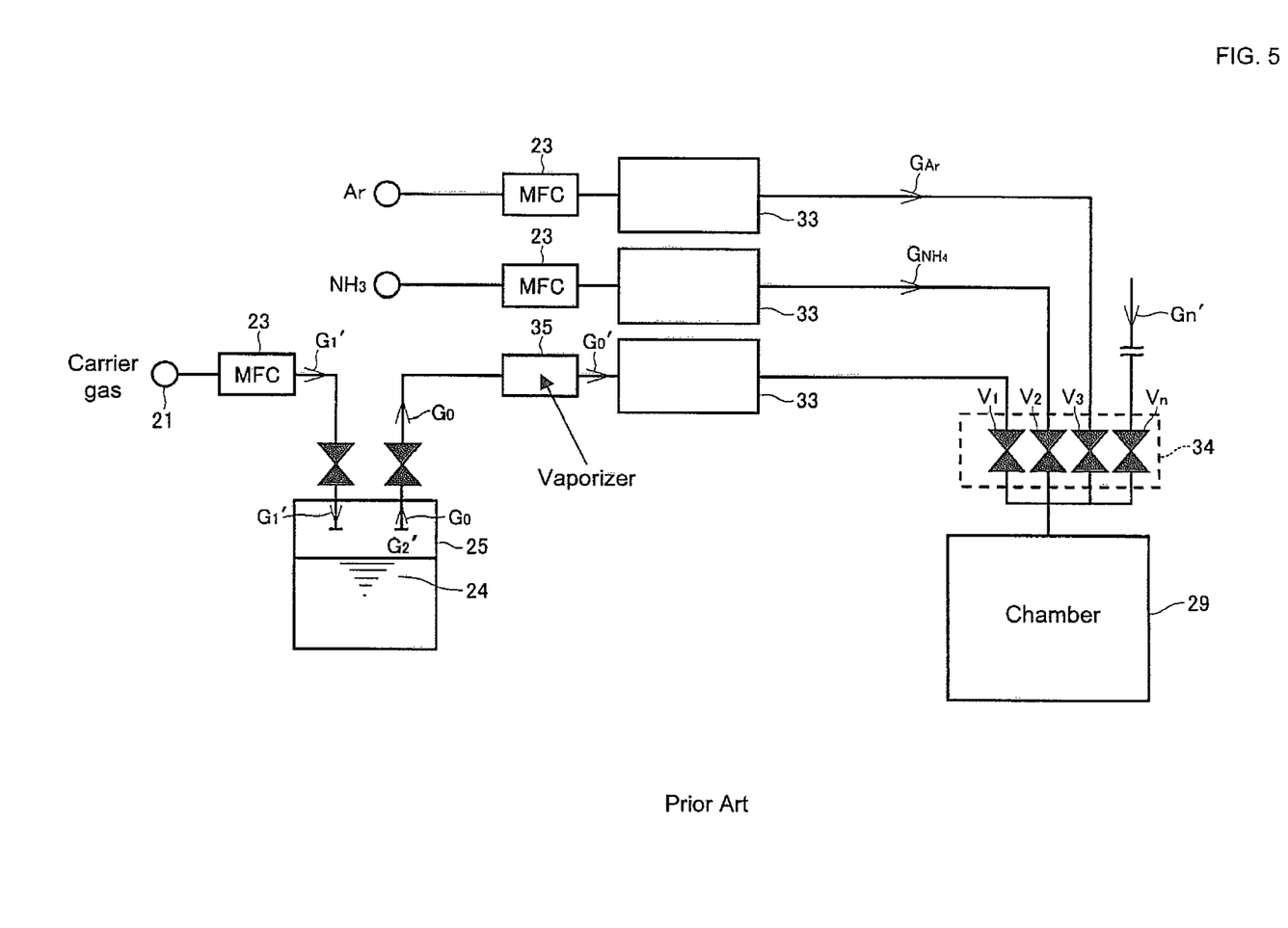
FIG. 5 is a systematic schematic diagram showing a configuration of another conventional raw material gas supply apparatus.

FIG. 5 shows another example of this type of raw material gas supply apparatus. A liquid raw material gas ($TiCl_4$) in the source tank 25 is evaporated by a bubbling action of the carrier gas $G_1'$, a mixed volume $G_0$ of the carrier gas $G_1'$, raw material gas steam $G_2'$, and raw material gas particles associated with the carrier gas, are made to flow into a vaporizer 35, and a vaporized mixed gas $G_0'$ is supplied to a valve opening/closing mechanism 34 through buffer tanks 33, and a mixed gas $G_0'$ of a predetermined quantity is supplied to the inside of the chamber 29 by opening/closing control (on/off control) of the valve $V_1$.

In addition, in FIG. 5, respectively, the liquid raw material gas ($TiCl_4$) 24 in the source tank 25 is heated to about 100° C. (steam pressure of 269 Torr), and the vaporizer 35 is heated to about 200° C., and the respective buffer chambers 33 (whose internal volumes are about 500 to 1000 cc) are heated to about 170° C., and the valve opening/closing mechanism 34 is heated to about 200° C. Furthermore, the flow rate of supplying the mixed gas ($TiCl_4$+carrier gas) $G_0'$ is about 20 sccm (standard cubic centimeters per minute), and the supply pressures of argon (Ar) and ammonia ($NH_3$) are 0.15 PaG, and the supply flow rates thereof are respectively about 10 SLM (Standard Liter per Minute). Moreover, the internal volume of the process chamber 29 is 500 to 1000 cc, and the internal pressure thereof is kept to 1 Torr or less.

At the time of supplying the raw material gases to the chamber 29, the respective raw material gases stored in the respective buffer tanks 33 at predetermined internal pressures are supplied in sequence by predetermined quantities by sequentially turning on/off the opening/closing valves $V_1$ to $V_n$ in the valve opening/closing mechanism 34 at predetermined time intervals (for example, an opening time is about 0.2 seconds and a closing time is about 0.93 seconds in the case of $TiCl_4$), in order to perform one cycle of film formation.

In the gas supply apparatus shown in FIG. 4, because the pressure of the space portion in the source tank 25 (the pressure of the mixed gas $G_0'$) is kept to a set value by the automatic pressure regulating device 27 in the source tank, it is possible to supply the raw material gas $G_0'$ of a predetermined quantity to the valve opening/closing mechanism 34 (i.e., opening/closing valve $V_1$ in particular) while highly accurately controlling the flow rate thereof even without using the buffer tanks 33. This is because the gas supply apparatus of FIG. 4 does not employ buffer tanks.

Furthermore, in the gas supply apparatus shown in FIG. 5 as well, because the buffer tanks 33 are used, there are no pressure fluctuations in the respective raw material gases $G_0'$, $G_{Ar}$, and $G_{NH3}$ to be supplied. This makes it possible to supply the respective raw material gases $G_0'$, $G_{Ar}$, and $G_{NH3}$ at predetermined flow rates to the inside of the chamber 29 through the valve opening/closing mechanism 34, which exerts an excellent effect.

However, there remain many unsolved problems in the conventional gas supply apparatuses shown in FIG. 4 and FIG. 5. First, in the gas supply apparatuses shown in FIG. 4 and FIG. 5, because the steam $G_2'$ of the liquid raw material gas 24 is supplied as a raw material gas to the process chamber 29 by use of the carrier gas $G_1'$, it is not possible to directly supply only the steam $G_2'$ of the liquid raw material gas 24 to the process chamber 29. That is, it is not possible to supply only the stream $G_2'$ of the liquid raw material gas 24 to the process chamber 29 without the use of a carrier gas. As a result, there is a problem that it takes a lot of time and effort for managing the concentration of the raw material gas $G_2'$ in the mixed gas $G_0'$, which makes it difficult to highly accurately control the supply quantity of the raw material gas $G_2'$.

Furthermore, in the gas supply apparatus shown in FIG. 4, there are problems listed as follows: (A) because the expensive thermal type mass flow control system 23 is used, it is difficult to reduce the manufacturing cost for raw material vaporizing and supplying apparatuses and, additionally, it is necessary to highly accurately control the carrier gas supply pressure to the thermal type mass flow control system 23, which leads to an increase in the equipment cost for the pressure regulator 22; (B) it is not possible to directly control a flow rate of the mixed gas $G_0'$ by the thermal type mass flow control system 23; (C) because the apparatus adopts the bubbling method, it is difficult to stably supply raw material steam in the case of a solid raw material, or a raw material at low steam pressure, which often makes it unstable to supply a mixed gas to the process chamber; (D) the concentration of the raw material steam $G_2'$ in the mixed gas $G_0'$ significantly fluctuates according to a fluctuation in the raw material liquid level in the source tank, which makes it difficult to control the concentration of the raw material steam $G_2'$; (E) because the carrier gas flow rate on the inlet side and the mixed gas flow rate (total flow rate) on the outlet side are different from each other, highly accurate flow control of the mixed gas flow rate is difficult; and (F) it is not easy to highly accurately control the internal pressure of the source tank and, as a result, it is not easy to regulate a raw material concentration directly relating to the partial pressure of the raw material steam in the mixed gas in the tank, and the like.

Moreover, in the gas supply apparatus in FIG. 5, in addition to the problems of (A) to (F) in the gas supply apparatus in FIG. 4, as listed above, there is a problem that, because the apparatus is configured to control a supply quantity of the raw material gas $G_0'$ by adjusting its opening/closing switching time by use of the opening/closing valve $V_1$ provided in the switching mechanism 34 as a pulse-driven valve, not only is achieving highly accurate flow rate control difficult, but also it takes a lot of time and effort for maintenance and management of the opening/closing valve $V_1$. Moreover, in the gas supply apparatus of FIG. 5, the buffer chambers 33 are required in order to stabilize the supply pressure of the raw material gas $G_0'$, which makes it impossible to downsize the apparatus.

CITATION LIST

Patent Document

Patent Document 1: Japanese Patent No. 4605790.
Patent Document 2: Japanese Published Unexamined Patent Application No. 2009-226408.

Problems to be Solved by the Invention

It is an object of the present invention to solve the problems described above in the conventional gas supply apparatuses of FIG. 4 and FIG. 5, that is, the problems of (A), wherein it is not possible to stably supply only a raw material gas singularly while highly accurately controlling a flow rate, and (B) wherein because the apparatus is configured to control a flow rate of supplying the raw material gas by controlling the opening or closing of the pulse-driven valve provided just proximal to the process chamber, highly accurate flow rate control is difficult, and (C) wherein because the buffer chambers are used, and/or the thermal type flow control device is used, it is difficult to significantly downsize the raw material gas supply apparatus and reduce the manufacturing cost thereof, and the like. It is also an object of the present invention to provide a raw material gas supply apparatus that is capable of supplying only a raw material gas singularly without using a carrier gas and, in addition, does so without using a thermal type mass flow control system and/or a flow control pulse-driven valve, and that is capable of stably supplying a raw material gas while highly accurately controlling a flow rate by adjusting the raw material gas pressure inside the gas distribution passage on the secondary side by an automatic pressure regulating device provided inside a raw gas passage, and by use of an orifice.

SUMMARY OF THE INVENTION (MEANS FOR SOLVING THE PROBLEMS)

In accordance with a first embodiment of the invention, a basic configuration of the invention pertains to a raw material gas supply apparatus for semiconductor manufacturing equipment, which includes (i) a liquid raw material gas supply source, (ii) a source tank in which the liquid raw material gas is stored, (iii) a gas distribution passage through which a raw material gas that is a liquid raw material gas steam is supplied from an internal upper space portion of the source tank to a process chamber, (iv) an automatic pressure regulator that is installed on an upstream side of the gas distribution passage, wherein the automatic pressure regulator keeps supply pressure of the raw material gas, which is supplied to the process chamber, at a set value, (v) a supply gas switching valve that is installed on a downstream side of the gas distribution passage, wherein the supply gas switching valve opens and closes the passage for the raw material gas that is supplied to the process chamber, (vi) a throttling unit that is provided with at least one of an inlet side or an outlet side of the supply gas switching valve, wherein the throttling unit regulates a flow rate of the raw material gas that is supplied to the process chamber, and (vii) a constant temperature heating device that heats the source tank, the gas distribution passage, the supply gas switching valve and the throttling unit to a set temperature, and wherein the raw material gas at a set flow rate is supplied to the process chamber while controlling supply pressure of the raw material gas on a downstream side of the automatic pressure regulator, to be a desired pressure.

In accordance with a second embodiment of the invention, the first embodiment of the invention is modified so that the liquid raw material gas is titanium tetrachloride ($TiCl_4$).

In accordance with a third embodiment of the invention, the first embodiment of the invention is modified so that the throttling unit is provided on the inlet side of the supply gas switching valve.

In accordance with a fourth embodiment of the invention, the first embodiment of the invention is modified so that the source tank is heated to a temperature of 100° C. to 250° C. by the constant temperature heating device.

In accordance with a fifth embodiment of the invention, the first embodiment of the invention is modified so that the gas distribution passage, the automatic pressure regulator, the throttling unit and the switching valve are heated to a temperature of 100° C. to 250° C. by the constant temperature heating device.

In accordance with a sixth embodiment of the invention, the first embodiment of the invention is modified so that a gas distribution passage through which argon gas is supplied and a gas distribution passage through which ammonia gas is supplied are respectively provided in parallel to the gas distribution passage for the raw material gas.

EFFECT OF THE INVENTION

The present invention is configured to keep a temperature in the source tank at a set value, and to control the supply pressure of a raw material gas $G_1$, which is steam of a liquid raw material gas introduced from an internal upper space portion of the source tank, by employing the automatic pressure regulating device, and to supply the raw material gas $G_1$ to the process chamber via the throttling unit while keeping the raw material gas pressure in the gas distribution passage on the secondary side of the automatic pressure regulating device at a desired set pressure. As a result, it is possible to supply only the raw material gas $G_1$ while highly accurately controlling the flow rate of the supplied gas without using a carrier gas, which makes it possible to stably supply the raw material gas $G_1$ and to significantly improve the flow rate controllability.

Furthermore, the distribution passage for the raw material gas $G_1$ is composed of the automatic pressure regulating device, the throttling unit and the supply gas switching valve, which is a simple structure that makes it possible to significantly downsize the raw material gas supply apparatus for semiconductor manufacturing equipment, and that makes it easy to judge a consumed quantity of the liquid raw material gas. In addition, backflow of a different type of gas at the time of switching the supply of a raw material gas is effectively prevented by the orifice employed by preferred embodiments of the invention.

Moreover, the supply pressure of the raw material gas $G_1$ is kept constant by the automatic pressure regulating device, and a caliber of the throttling unit is appropriately selected, and a temperature regulation of the source tank and the raw material gas $G_1$ is performed, thereby making it possible to control a supply flow rate of the raw material gas $G_1$ with an extremely high accuracy, which makes it possible to give high performance of the so-called "film formation" processes, and significantly improve the quality of semiconductor products.

DETAILED DESCRIPTION OF THE PREFERRED EMBODIMENTS

Figure 1:
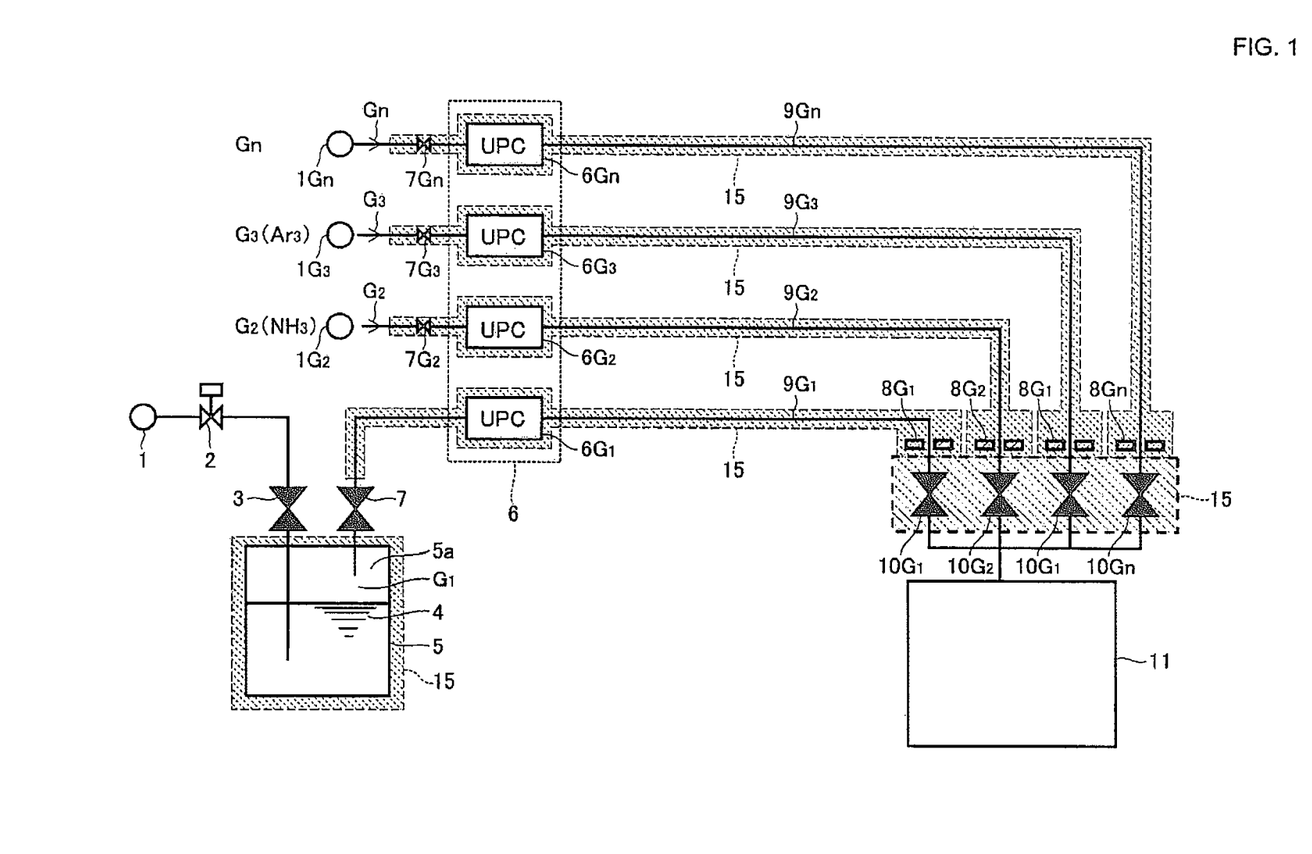
FIG. 1 is a systematic schematic diagram showing a configuration of a raw material gas supply apparatus according to an embodiment of the present invention.

Hereinafter, an embodiment of the present invention will be described with reference to the drawings. FIG. 1 is a systematic diagram showing a configuration of a raw material gas supply apparatus according to an embodiment of the present invention. The raw material gas supply apparatus is composed of a liquid raw material tank 1, a liquid raw material flow rate meter 2, a liquid raw material supply valve 3, a liquid raw material gas 4, a source tank 5, a raw material gas outlet valve 7, an automatic pressure regulating device 6 that controls internal pressure of distribution passages 9 for the raw material gas supplied to a process chamber 11, a throttling unit 8 (here, orifices $8G_1$, $8G_2$, $8G_3$ and $8G_n$ are used) that regulates a flow rate of supplying a gas G that is supplied to the process chamber 11, the gas distribution passages 9, supply gas switching valves 10, a constant temperature heating device 15 that heats the gas distribution passages 9, the source tank 5, and the like.

In addition, in FIG. 1, in addition to the liquid raw material tank 1, an ammonia gas tank $1G_2$, an argon gas tank $1G_3$ and another gas tank $1G_n$, are provided, and automatic pressure regulators $6G_2$, $6G_3$ and $6G_n$, orifices $8G_2$, $8G_3$ and $8G_n$, and supply switching valves $10G_2$, $10G_3$ and $10G_n$ are respectively provided to the respective gas distribution passages $9G_2$, $9G_3$ and $9G_n$, and raw material gases $G_1$, $G_2$, $G_3$ and $G_n$ are respectively supplied to the process chamber 11.

With reference to FIG. 1, the liquid raw material gas 4 is supplied from the liquid raw material tank 1 through the flow rate meter 2 and the liquid raw material supply valve 3, to the inside of the source tank 5, and is heated to a predetermined temperature by the constant temperature heating device 15, to be stored in the source tank in a heated state. In addition, since titanium tetrachloride ($TiCl_4$) is used as one of the liquid raw material gases in the present embodiment, the liquid raw material gas 4 will hereinafter be described as $TiCl_4$.

With respect to the liquid raw material gas 4 in the source tank 5, by heating the source tank 5 to about 100° C. to 110° C., steam $G_1$ at a saturated steam pressure (for example, at 100° C. and 269 Torr) of the liquid raw material gas 4 at its heated temperature is generated, so as to fill the inside of an internal upper space portion 5a of the source tank 5. The generated saturated steam $G_1$ of the liquid raw material gas 4 flows through the raw material gas outlet valve 7, into an automatic pressure regulator $6G_1$, and is regulated to a predetermined set pressure by the automatic pressure regulator $6G_1$, and is supplied through the orifice $8G_1$ and the raw material gas supply switching valve $10G_1$, into the process chamber 11.

The aforementioned automatic pressure regulator $6G_1$ is provided near the outlet side of the raw material gas $G_1$ from the source tank 5. The automatic pressure regulator $6G_1$ is for automatically regulating the pressure on the secondary side (i.e., downstream side) of the automatic pressure regulator $6G_1$ of the raw material gas $G_1$ from the source tank 5 to a predetermined set value. That is, as shown in FIG. 2, the aforementioned automatic pressure regulator $6G_1$ detects a pressure $P_1$ and a temperature $T_1$ of the raw material gas $G_1$ on the outflow side of the automatic pressure regulator $6G_1$, and carries out a temperature correction in an arithmetic and control unit 12 by use of the detected pressure $P_1$ and the temperature $T_1$, thereby carrying out an operation for correcting detected pressure to the actual pressure of the high-temperature mixed gas $G_1$, and moreover, the arithmetic and control unit 12 compares the computed pressure value Pt of the raw material gas $G_1$ and a set pressure value Ps from a set input terminal 13, to control the opening or closing of a control valve $V_0$ in a direction in which a deviation Pd between both the set pressure value Ps and the computed pressure value Pt becomes zero.

Figure 2:
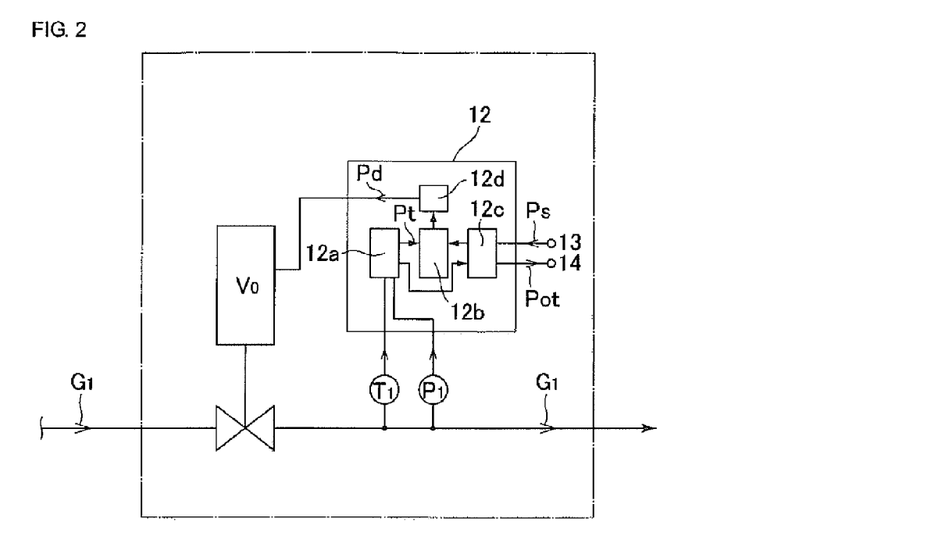
FIG. 2 is an explanatory diagram of a configuration of an automatic pressure regulating device employed by the present invention, namely, automatic pressure regulator $6G_1$.

In addition, FIG. 2 shows a block configuration of the automatic pressure regulator $6G_1$, and the arithmetic and control unit 12 of automatic pressure regulator $6G_1$, which is composed of a temperature correction circuit 12a, a comparison circuit 12b, an input-output circuit 12c, an output circuit 12d, and the like. That is, the detection values from a pressure detector $P_1$ and a temperature detector $T_1$ are converted into digital signals, to be input to the temperature correction circuit 12a, and the detection pressure $P_1$ is corrected to a detection pressure Pt therein, to be thereafter input to the comparison circuit 12b. Furthermore, an input signal Ps of the set pressure is input from the terminal 13, to be converted into a digital value in the input-output circuit 12c, and is thereafter input to the comparison circuit 12b. In the case where the set pressure input signal Ps is higher than the temperature-corrected detection pressure Pt from the temperature correction circuit 12a, a control signal Pd is output to the drive unit of the control valve $V_0$. As a result, the control valve $V_0$ is driven toward the valve-closing direction, so as to be driven toward the valve-closing direction until a difference signal Pd=Ps−Pt between the set pressure input signal Ps and the temperature-corrected detection pressure Pt becomes zero.

Furthermore, in contrast, in the case where the set pressure input signal Ps is lower than the temperature-corrected detection pressure Pt, a control signal Pd is output to the drive unit of the control valve $V_0$, and the control valve $V_0$ is driven toward the valve-opening direction. As a result, the control valve $V_0$ is driven toward the valve-opening direction, and the arithmetic and control unit 12 continues to send a difference signal Pd to the drive unit of the control valve $V_0$ that drives the control valve $V_0$ toward the valve-opening direction until the difference signal Pd=Ps−Pt becomes zero.

As shown in FIG. 1, the raw material gas $G_1$, whose gas pressure on the secondary side is kept at the set pressure by the automatic pressure regulator $6G_1$, is supplied through the supply gas switching valve $10G_1$ to the process chamber 11 at a predetermined flow rate corresponding to the set pressure of the raw material gas $G_1$ at the orifice $8G_1$, and corresponding to a caliber of the orifice $8G_1$ and a gas temperature of the raw material gas $G_1$.

In addition, the above description describes only the line corresponding to the gas distribution passage $9G_1$ for the raw material gas $G_1$. However, the other lines, such as correspond to the gas distribution passage $9G_2$ and the gas distribution passage $9G_3$ as well, etc., are completely structurally the same as the case of the gas distribution passage $9G_1$ except for the portion that connects to the source tank 5.

Furthermore, the orifices 8 ($8G_1$, $8G_2$, $8G_3$, $8G_n$) are provided on the upstream side of the supply gas switching valves 10 ($10G_1$, $10G_2$, $10G_3$, $10G_n$) in the above-described description. However, the orifices 8 ($8G_1$, $8G_2$, $8G_3$, $8G_n$) may be provided on the downstream side of the supply gas switching valves 10 ($10G_1$, $10G_2$, $10G_3$, $10G_n$), or they may be provided both on the upstream side and the downstream side.

Moreover, in the above-non-limiting embodiment, titanium tetrachloride is used as the liquid raw material gas. However, as a matter of course, a different liquid raw material may be used as the liquid raw material gas, such as TEOS (Tetraethyl Orthosilicate), for example. However, the heating temperature for the source tank 5, the gas distribution passages 9 ($9G_1$, $9G_2$, $19G_3$, $9G_n$) and the supply gas switching valves 10 ($10G_1$, $10G_2$, $10G_3$, $10G_n$) by the constant temperature heating device 15 is appropriately selected according to the saturated steam pressure of the particular liquid raw material gas that is used, and the required flow rate and pressure likewise must be appropriately selected depending upon the particular raw material gas that is used.

In accordance with the present invention, the pressure and the temperature of the raw material gas on the secondary side of the automatic pressure regulating device 6 are kept at set values by the automatic pressure regulating device 6, and the flow rate of the raw material gas is regulated via the orifices 8. Therefore, there is absolutely no need to perform aperture control of the supply gas switching valves 10 for regulating a flow rate, as in the conventional techniques, and it suffices to merely switch among supply gases. Accordingly, it is possible to perform more highly accurate flow control when employing a raw material gas by itself, or when employing the raw material gas to a process chamber 11 in combination with other gases.

Furthermore, in accordance with the present invention, it is possible to directly supply only a required raw material gas to the process chamber 11 under highly accurate flow control, which makes it possible to make the raw gas distribution passages 9, and the like, smaller in calibers and a simplification thereof can be made, and there is no need to manage the concentration of the raw material gas.

Figure 3:
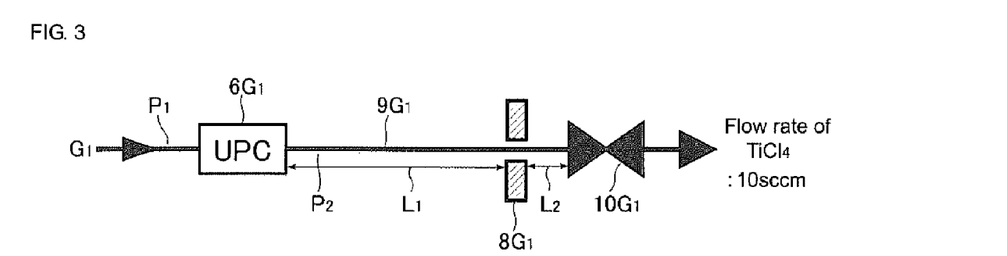
FIG. 3 shows an example of pressure, temperature, flow rate, and the like, of a raw material gas supply line according to an embodiment of the present invention.

FIG. 3 shows the relationship among the pressure, temperature, flow rate, and the like, of the gas distribution passage $9G_1$, which includes the automatic pressure regulator $6G_1$ in the case where the raw material gas is $TiCl_4$, and the flow rate of the $TiCl_4$ gas is 10 sccm. It has been confirmed by the inventors that it is possible to supply the $TiCl_4$ gas at 10 sccm under the conditions that the source tank temperature=100° C., the $TiCl_4$ gas pressure in the source tank internal space 5a=269 Torr (100° C.), the pressure $P_1$ on the upstream side of the automatic pressure regulator $6G_1$=269 Torr, the pressure $P_2$ on the downstream side of the automatic pressure regulator $6G_1$=200 Torr, and the caliber of the orifice $8G_1$ is 0.1 mmφ. In addition, a distance $L_2$ between the orifice $8G_1$ and the supply gas switching valve $10G_1$ is set to 10 mm or less, and a distance $L_1$ between the automatic pressure regulator $6G_1$ and the orifice $8G_1$ is set to about 2 m.

In addition, because the flow rate of the $TiCl_4$ gas is a function of temperature, it is possible to regulate the flow rate of such a raw material gas $G_1$ by regulating the control pressure $P_2$ on the secondary side of the automatic pressure regulator $6G_1$.

The $NH_3$ gas distribution passage $9G_2$ as well, in the case where $NH_3$ gas $G_2$=10 SLM, has been reviewed by the same method. As a result of this review, it was found that when the control pressure $P_2$ of the automatic pressure regulator $6G_2$=790 Torr, and the temperature is 23° C., and the caliber of the orifice $8G_2$=1.0 mm, it is possible to supply the $NH_3$ raw material gas $G_2$ at a flow rate of about 10 SLM (when the pressure on the downstream of the orifice satisfies the critical expansion conditions with respect to $P_2$).

Furthermore, with respect to the Ar gas distribution passage $9G_2$ as well, when the control pressure $P_2$ of the automatic pressure regulator $6G_3$=100 Torr, and the temperature is 23° C., and the caliber of the orifice $8G_3$=1.0 mm, it is possible to supply the Ar gas $G_3$ at a flow rate of about 10 SLM (when the pressure on the downstream of the orifice satisfies the critical expansion conditions with respect to $P_2$).

INDUSTRIAL APPLICABILITY

The present invention is applicable not only to a raw material vaporizing and supplying apparatus used for an ALD method, for example, but it is also applicable to all the gas supply apparatuses that are configured to supply gas from a pressurizing reservoir source to a process chamber in semiconductor manufacturing equipment, chemical products manufacturing equipment, or the like. Thus, in accordance with the present invention, it is possible to stably supply only a raw material gas, which is a steam of a liquid raw material gas, to a process chamber without using a carrier gas while controlling the flow rate of the raw material gas in a highly accurate manner, and it is also possible to simplify and downsize the structure of a raw material gas supply apparatus that is used to supply the raw material gas.

Broadly construed, the present invention pertains to a raw material gas supply apparatus that includes (a) a liquid raw material supply source, (b) a source tank in which the liquid raw material is stored, (c) a gas distribution passage through which a raw material gas, which is a steam of the liquid raw material, is supplied from an internal upper space portion of the source tank to a process chamber, (d) an automatic pressure regulator that is installed on an upstream side of the gas distribution passage, wherein the automatic pressure regulator keeps supply pressure of the raw material gas that is supplied to the process chamber at a set value, (e) a supply gas switching valve that is installed on a downstream side of the gas distribution passage, wherein the supply gas switching valve opens and closes the passage for the raw material gas that is supplied to the process chamber, (f) an orifice that is provided on at least one of an inlet side or an outlet side of the supply gas switching valve, wherein the orifice regulates the flow rate of the raw material gas supplied to the process chamber, and (g) a constant temperature heating device that heats the source tank, the gas distribution passage, the supply gas switching valve and the orifice to a set temperature, and wherein the raw material gas at a set flow rate is supplied to the process chamber while controlling supply pressure of the raw material gas on a downstream side of the automatic pressure regulator to be a desired pressure.

DESCRIPTION OF REFERENCE SYMBOLS $G_1$: Raw material gas
$G_2$: Ammonia gas
$G_3$: Argon gas
$G_n$: Another gas
1: Liquid raw material gas tank (titanium tetrachloride)
$1G_2$: Ammonia gas tank
$1G_3$: Argon gas tank
$1G_n$: Gas tank for another type gas
2: Liquid raw material flow rate meter
3: Liquid raw material supply valve
4: Liquid raw material gas (titanium tetrachloride, $TiCl_4$)
5: Source tank
5a: Internal space of source tank
6: Automatic pressure regulating device
$6G_1$: Automatic pressure regulator for titanium tetrachloride gas
$6G_2$: Automatic pressure regulator for ammonia gas
$6G_3$: Automatic pressure regulator for argon gas
$6G_n$: Automatic pressure regulator for another gas
7: Raw material gas outlet valve
$7G_2$: Ammonia gas outlet valve
$7G_3$: Argon gas outlet valve
$7G_n$: Another gas outlet valve
8: Throttling unit (orifices)
$8G_1$: Orifice for titanium tetrachloride gas
$8G_2$: Orifice for ammonia gas
$8G_3$: Orifice for argon gas
$8G_n$: Orifice for another gas
9: Gas distribution passage
$9G_1$: Titanium tetrachloride gas distribution passage
$9G_2$: Ammonia gas distribution passage
$9G_3$: Argon gas distribution passage
$9G_n$: Another gas distribution passage
10: Supply gas switching valve ($10G_1$, $10G_2$, $10G_3$, $10G_n$)
11: Process chamber
12: Arithmetic and control unit
12a: Temperature correction circuit
12b: Comparison circuit
12c: Input-output circuit
12d: Output circuit
$V_0$: Control valve
13: Set input terminal
14: Output signal terminal
15: Constant temperature heating device
$P_1$: Pressure of $G_1$ (detection pressure)
$T_1$: Temperature of $G_1$ (detection temperature)
Pt: Corrected detection pressure
Ps: Set pressure input signal
Pd: Control signal
Pot: Output signal
21: Carrier gas source
22: Pressure regulator
23: Mass flow controller
24: Liquid raw material gas ($TiCl_4$)
25: Source tank
26: Constant temperature heating unit
27: Source tank internal pressure automatic pressure regulating device
27a:
28: Terminal
29: Process chamber
30: Heater
31: Wafer
32: Vacuum pump
33: Buffer chamber 34: Valve opening/closing mechanism
35: Vaporizer
$G_1'$: Carrier gas
$G_2'$: Steam of liquid raw material
$G_0'$: Mixed gas
$G_n'$: Another raw material gas
CV Pressure control valve
$V_1, V_2, V_3, V_n$: Opening/closing valve
$G_0$: Mixed volume

What is claimed is:

1. A raw material gas supply apparatus for semiconductor manufacturing equipment comprising:
   (a) a liquid raw material supply source;
   (b) a source tank that stores liquid raw material supplied by the liquid raw material supply source through a liquid raw material flow rate meter and a liquid raw material supply valve;
   (c) a first gas distribution passage through which a raw material gas passes to a process chamber, wherein the raw material gas is steam of the liquid raw material that is supplied from an internal upper space portion of the source tank;
   (d) an automatic pressure regulator installed on an upstream side of the first gas distribution passage, wherein the automatic pressure regulator keeps a supply pressure of the raw material gas that is supplied to the process chamber at a set pressure value, wherein the automatic pressure regulator comprising,
   i. a control valve;
   ii. a gas pressure detector and a gas temperature detector provided on the downstream side of the control valve;
   iii. a temperature correction circuit to correct detected gas pressure;
   iv. an input-output circuit of a set pressure;
   v. a comparison circuit comparing a temperature-corrected detection pressure from the temperature correction circuit and the set pressure from the input-output circuit; and
   vi. an output circuit that output a control signal proportional to a difference between the temperature-corrected detection pressure and the set pressure to the control valve;
   (e) a supply gas switching valve installed near the process chamber on a downstream side of the first gas distribution passage, wherein the supply gas switching valve opens the first gas distribution passage for a certain period of time so as to supply a set flow rate of the raw material gas to the process chamber;
   (f) a throttling unit provided on an inlet side of the supply gas switching valve, wherein the throttling unit regulates a flow rate of the raw material gas that is supplied to the process chamber to a predetermined flow rate value which is proportional to the set pressure;
   (g) a constant temperature heating device that heats the source tank, the first gas distribution passage, the supply gas switching valve and the throttling unit to a set temperature; and
   (h) a plurality of gas distribution passages for a plurality of different raw material gases provided in parallel to and independently from the first gas distribution passage for the raw material gas and supplying a set flow rate of desired different raw material gases separately to the process chamber, wherein each of the plurality of gas distribution passages is provided with a gas tank storing a desired different raw material gas, an automatic pressure regulator, a gas supply passage between the tank storing desired different raw material gas and the automatic pressure regulator, a throttling unit, a supply gas switching valve and a constant temperature heating device, wherein the raw material gas and the different raw material gases at the set flow rate are supplied to the process chamber separately through the each opened supply gas switching valve, while the supply pressures of the raw material gas in the first gas distribution passage and the different raw material gases in the plurality of gas distribution passages between a downstream side of the control valve of the automatic pressure regulator and the throttling unit are controlled to desired pressures by the automatic pressure regulators provided on the first gas distribution passage for the raw material gas and the plurality of gas distribution passages for different raw material gases; wherein the raw material gas that is supplied to the process chamber is supplied to the process chamber without a carrier gas.

2. The raw material gas supply apparatus for semiconductor manufacturing equipment according to claim 1, wherein the raw material gas is titanium tetrachloride ($TiCl_4$).

3. The raw material gas supply apparatus for semiconductor manufacturing equipment according to claim 1, wherein the throttling unit is provided on the inlet side of the supply gas switching valve.

4. The raw material gas supply apparatus for semiconductor manufacturing equipment according to claim 1, wherein the source tank is heated to a temperature of 100° C. to 250° C. by the constant temperature heating device.

5. The raw material gas supply apparatus for semiconductor manufacturing equipment according to claim 1, wherein the first gas distribution passage, the automatic pressure regulator, the throttling unit and the switching valve are heated to a temperature of 100° C. to 250° C. by the constant temperature heating device.

6. The raw material gas supply apparatus for semiconductor manufacturing equipment according to claim 1, wherein argon gas is supplied to the process chamber through a second gas distribution passage of the plurality of gas distribution passages, wherein ammonia gas is supplied to the process chamber through a third gas distribution passage of the plurality of gas distribution passages, and wherein the second and third gas distribution passages are respectively provided in parallel to the first gas distribution passage.

7. The raw material gas supply apparatus for semiconductor manufacturing equipment according to claim 6, wherein the throttling unit comprises a plurality of orifices, wherein each of the first gas distribution passage, the second gas distribution passage and the third gas distribution passage is provided with one orifice of the plurality of orifices.

* * * * *